(12) United States Patent
Nakamura

(10) Patent No.: US 9,064,987 B2
(45) Date of Patent: Jun. 23, 2015

(54) PHOTODIODE-TYPE ULTRAVIOLET SENSOR HAVING A STACKED STRUCTURE AND METHOD FOR PRODUCING THE SAME

(71) Applicant: MURATA MANUFACTURING CO., LTD., Nagaokakyo-Shi, Kyoto-fu (JP)

(72) Inventor: Kazutaka Nakamura, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 14/011,884

(22) Filed: Aug. 28, 2013

(65) Prior Publication Data

US 2013/0341619 A1   Dec. 26, 2013

Related U.S. Application Data

(63) Continuation of application No. PCT/JP2012/055801, filed on Mar. 7, 2012.

(30) Foreign Application Priority Data

Mar. 9, 2011   (JP) .................... 2011-051030

(51) Int. Cl.
| | | |
|---|---|---|
| H01L 29/10 | (2006.01) | |
| H01L 31/0232 | (2014.01) | |
| G01J 1/02 | (2006.01) | |
| G01J 1/42 | (2006.01) | |
| H01L 31/0224 | (2006.01) | |
| H01L 31/0296 | (2006.01) | |
| H01L 31/18 | (2006.01) | |

(52) U.S. Cl.
CPC ......... *H01L 31/02325* (2013.01); *G01J 1/0252* (2013.01); *G01J 1/429* (2013.01); *H01L 31/022408* (2013.01); *H01L 31/0296* (2013.01); *H01L 31/18* (2013.01)

(58) Field of Classification Search
CPC ...................... H01L 31/02325; H01L 31/18
USPC .................... 257/43, 414, 428, 431
See application file for complete search history.

(56) References Cited

U.S. PATENT DOCUMENTS

2009/0057805 A1* 3/2009 Nakamura et al. ............ 257/461

FOREIGN PATENT DOCUMENTS

| JP | S59-34621 | 2/1984 |
|---|---|---|
| JP | H11-297533 | 10/1999 |
| JP | 2009-300206 A | 12/2009 |

(Continued)

OTHER PUBLICATIONS

PCT/JP2012/055801 ISR dated Sep. 4, 2012.
PCT/JP2012/055801 ISR Written Opinion dated Sep. 4, 2012.

*Primary Examiner* — Hung Vu
(74) *Attorney, Agent, or Firm* — Arent Fox LLP

(57) ABSTRACT

An ultraviolet sensor having a p-type semiconductor layer containing, as its main constituent, a solid solution of NiO and ZnO, and an n-type semiconductor layer containing ZnO as its main constituent, which is joined to the p-type semiconductor layer such that a portion of the p-type semiconductor layer is exposed. An internal electrode is buried in the p-type semiconductor layer and opposed to the n-type semiconductor layer. Both ends of the internal electrode are exposed at both end surfaces of the p-type semiconductor layer, and first and second high-resistance layers composed of insulating materials cover one end of the internal electrode. The second high-resistance layer is obtained by diffusion of the insulating material from the first high-resistance layer into the p-type semiconductor layer. A first external electrode is connected to the other end of the internal electrode, and a second external electrode is connected to the n-type semiconductor layer.

9 Claims, 7 Drawing Sheets

(56) References Cited

FOREIGN PATENT DOCUMENTS

| | | |
|---|---|---|
| JP | 2010-087482 A | 4/2010 |
| JP | 2011-014710 A | 1/2011 |
| WO | WO-2007122750 A1 | 11/2007 |
| WO | WO-2011-158827 A1 | 12/2011 |

* cited by examiner

PHOTODIODE-TYPE ULTRAVIOLET SENSOR HAVING A STACKED STRUCTURE AND METHOD FOR PRODUCING THE SAME

CROSS REFERENCE TO RELATED APPLICATIONS

The present application is a continuation of International application No. PCT/JP2012/055801, filed Mar. 7, 2012, which claims priority to Japanese Patent Application No. 2011-051030, filed Mar. 9, 2011, the entire contents of each of which are incorporated herein by reference.

FIELD OF THE INVENTION

The present invention relates to an ultraviolet sensor and a method for producing an ultraviolet sensor, and more particularly relates to a photodiode-type ultraviolet sensor which has a stacked structure of a p-type semiconductor layer and an n-type semiconductor layer joined in the form of a hetero junction by using an oxidized compound semiconductor, and a method for producing the ultraviolet sensor.

BACKGROUND OF THE INVENTION

Ultraviolet sensors have been widely used as ultraviolet detection devices such as germicidal lamps for killing bacteria floating in the air or in water and ultraviolet irradiation devices, and also expected to be applied to optical communication devices in recent years.

As this type of ultraviolet sensor, sensors using diamond semiconductors or SiC semiconductors as a sensing material have been known conventionally. However, these diamond semiconductors and SiC semiconductors have the drawbacks of inferior material workability and expensiveness.

Therefore, relatively inexpensive oxidized compound semiconductors which easily achieve good material workability have been attracting attention recently, and research and development of ultraviolet sensors which have a p-type semiconductor layer and an n-type semiconductor layer joined in the form of a hetero junction by using these oxidized compound semiconductors have been actively carried out.

For example, Patent Document 1 proposes, as shown in FIG. 11, an ultraviolet sensor including a (Ni, Zn)O layer 101 composed of an oxidized compound semiconductor which has a solid solution of ZnO in NiO, a thin-film material layer 103 formed by a sputtering method so as to cover a portion of one principal surface 102 of the (Ni, Zn)O layer 101, and first and second terminal electrodes 104a, 104b formed on both ends of the (Ni, Zn)O layer 101, where an internal electrode 105 is formed in the (Ni, Zn)O layer 101, and the first terminal electrode 104a is electrically connected to the internal electrode 105, whereas the second terminal electrode 104b is electrically connected to the thin-film material layer 103.

In Patent Document 1, the internal electrode 105 has one end electrically connected to the terminal electrode 104a, and the other end formed to extend substantially to the center in the (Ni, Zn)O layer 101. In addition, the thin-film material layer 103 is provided to be opposed to the internal electrode 105, and formed to have a partial overlap with the internal electrode 105 in planar view, and the thin-film material layer 103 is connected to the other terminal electrode 104b.

Further, in Patent Document 1, when ultraviolet irradiation is performed from above in the figure to expose a depletion layer formed at the joint interface between the (Ni, Zn)O layer 101 and the thin-film material layer 103 to the ultraviolet light, carriers are excited to generate photovoltaic power in an overlap a between the thin-film material layer 103 and the internal electrode 105.

Patent Document 1: JP 2010-87482 A (claim 1, FIG. 1)

SUMMARY OF THE INVENTION

In Patent Document 1, photovoltaic power depending on the ultraviolet intensity is generated in the overlap a between the thin-film material layer 103 and the internal electrode 105 as described above, and thus, in order to ensure the reliability of detection accuracy, there is a need to achieve stable light-receiving sensitivity which does not vary among products.

However, for this type of ultraviolet sensor, a so-called multiple cutout method in which a number of elements are prepared in an array on a large-sized substrate is typically employed from the perspective of ensuring favorable productivity. For this reason, even when the internal electrode 105 is formed by screen printing, variation is likely to occur in printing and cutting, and thus variation in dimension in the longitudinal direction or the width direction of the internal electrode is likely to occur.

Therefore, when the thin-film material layer 103 is formed by a sputtering method under such a condition, the overlap a is likely to vary in both the longitudinal direction and the width direction of the internal electrode 105. Moreover, the thin-film material layer 103 is also likely to vary in dimension, because the thin-film material layer 103 is formed by a sputtering method. Accordingly, the area of the overlap a (hereinafter, referred to as an "overlap area") between the internal electrode 105 and the thin-film material layer 103 is likely to vary among products, for this reason, the intensity of response to ultraviolet light is also likely to vary among products, and it is difficult to achieve photovoltaic power with stable reliability with a high degree of accuracy.

In addition, in the case of the photodiode-type ultraviolet sensor as in Patent Document 1, a diode is formed by a pn junction between the (Ni, Zn)O layer 101 and the thin-film material layer 103, and a resistance is thus formed between the internal electrode 105 and the second terminal electrode 104b to form a closed circuit. For this reason, there is a possibility that a weak current generated without ultraviolet irradiation will flow through the closed circuit to leak from the internal electrode 105 to the terminal electrode 104b, and lead to an increase in dark current.

The present invention has been achieved in view of these circumstances, and an object of the present invention is to provide a high-sensitivity and high-output ultraviolet sensor which can suppress the variation in characteristics among products, and also reduces a dark current with favorable reliability, and a method for producing the ultraviolet sensor.

In order to achieve the object, the present invention provides an ultraviolet sensor including: a p-type semiconductor layer containing, as its main constituent, a solid solution of NiO and ZnO; an n-type semiconductor layer containing ZnO as its main constituent, which is joined to the p-type semiconductor layer; and an internal electrode buried, or embedded in the p-type semiconductor layer to be opposed to the n-type semiconductor layer, wherein the n-type semiconductor layer is joined to the p-type semiconductor layer in a form that exposes a portion of the p-type semiconductor layer at a surface, both ends of the internal electrode are exposed at both end surfaces of the p-type semiconductor layer, and a high-resistance layer composed of an insulating material is formed so as to cover one end of the internal electrode, and a first external electrode is electrically connected to the other end of the internal electrode, whereas a second external electrode is electrically connected to the n-type semiconductor layer.

Thus, the internal electrode is formed from one end surface of the p-type semiconductor layer to the other end surface thereof. Therefore, the variation in dimension in the longitudinal direction of the internal electrode can be suppressed among products, thereby making it possible to reduce the variation in the overlap area formed between the internal electrode and the n-type semiconductor layer opposed thereto.

In addition, in the ultraviolet sensor according to the present invention, the high-resistance layer preferably has: a first high-resistance layer composed of the insulating material, which is interposed between the second external electrode and the p-type semiconductor layer; and a second high-resistance layer which has the insulating material diffused into the p-type semiconductor layer, so as to cover the one end of the internal electrode.

Thus, an ultraviolet sensor can be achieved in which the internal electrode has one end effectively insulated.

Furthermore, in the ultraviolet sensor according to the present invention, the width dimension of the n-type semiconductor layer along an end surface of the p-type semiconductor layer is preferably made larger than the width dimension of the internal electrode provided to be opposed to the n-type semiconductor layer.

In this case, the width dimension of the internal electrode is smaller than the width dimension of the n-type semiconductor layer, thus making it possible for the n-type semiconductor layer to also absorb the variation in dimension in the width direction of the internal electrode among products. Therefore, the overlap area can be stabilized generally among products, thereby making it possible to effectively suppress the variation in response to the ultraviolet intensity among products.

Alternatively, in the ultraviolet sensor according to the present invention, the width dimension of the internal electrode along an end surface of the p-type semiconductor layer may be preferably made larger than the width dimension of the n-type semiconductor layer provided to be opposed to the internal electrode.

In this case, because the width dimension of the n-type semiconductor layer is smaller than the width dimension of the internal electrode, the overlap area can be increased without protruding from the internal electrode, even when the n-type semiconductor layer varies in dimension. Therefore, it becomes possible to obtain an ultraviolet sensor which stabilizes photovoltaic power with respect to ultraviolet irradiation, and further improves the favorable response intensity.

In addition, in the ultraviolet sensor according to the present invention, the high-resistance layer is preferably colored in a color that is distinguishable from the other components.

This coloring makes it easy to visually recognize the orientation in the case of mounting onto a circuit board, thus makes it possible to reduce the work for selecting the orientation, and makes it possible to reduce the cost.

In addition, in the ultraviolet sensor according to the present invention, the internal electrode is preferably formed from a composite oxide containing a rare-earth element and Ni as its main constituents.

This eliminates the use of any expensive noble metal material such as Pt and Pd for the internal electrode material, and makes it easy for the insulating material to diffuse into the internal electrode, and an inexpensive and high-sensitivity ultraviolet sensor with favorable reliability can be thus obtained.

Furthermore, the ultraviolet sensor according to the present invention is an ultraviolet sensor including: a p-type semiconductor layer containing, as its main constituent, a solid solution of NiO and ZnO; an n-type semiconductor layer containing ZnO as its main constituent, which is joined to the p-type semiconductor layer; and an internal electrode buried in the p-type semiconductor layer to be opposed to the n-type semiconductor layer, wherein the internal electrode is exposed at both end surfaces and both side surfaces of the p-type semiconductor layer, and high-resistance layers composed of an insulating material are formed so as to cover both ends of the internal electrode, first and second external electrodes are formed on surfaces of the high-resistance layers, and the n-type semiconductor layer is electrically connected to the first and second external electrodes, and third external electrodes are formed on side surfaces of the p-type semiconductor layer.

In this case, also, the same operational advantage as described above can be achieved, and an ultraviolet sensor can be thus obtained which achieves the suppressed variation in characteristics among products. Moreover, since the effective distance can be shortened between external electrodes for extracting photovoltaic power, the output current can be further improved, and an ultraviolet sensor can be obtained which has further improved sensor performance. In addition, there is no need to consider the orientation in the case of mounting onto a circuit board.

In addition, also in the ultraviolet sensor according to the present invention, the high-resistance layers preferably have: first high-resistance layers composed of the insulating material, which are respectively interposed between the first and second external electrodes and the p-type semiconductor layer; and second high-resistance layers with the insulating material diffused into the p-type semiconductor layer, so as to cover the both ends of the internal electrode.

Furthermore, in the ultraviolet sensor according to the present invention, the internal electrode is also preferably formed from a composite oxide containing a rare-earth element and Ni as its main constituents.

Furthermore, the method for producing an ultraviolet sensor according to the present invention is a method for producing an ultraviolet sensor, which includes: a green sheet preparing step of preparing a plurality of green sheets containing, as their main constituent, a solid solution of NiO and ZnO; a conductive film forming step of forming a conductive film to serve as an internal electrode; a laminated body preparing step of preparing a laminated body by stacking the plurality of green sheets in a form that sandwiches the conductive film; a p-type semiconductor layer forming step of forming a p-type semiconductor layer with an internal electrode buried therein by firing the laminated body; and an n-type semiconductor layer forming step of forming an n-type semiconductor layer on a surface of the p-type semiconductor layer by sputtering with, as a target, a ZnO sintered body containing ZnO as its main constituent, wherein in the conductive film forming step, the conductive film is formed by applying a first conductive paste between both end surfaces of one of the green sheets, and the method includes a high-resistance layer forming step of forming a high-resistance layer in a form that covers one end of the internal electrode, by applying an insulating paste composed of an insulating material onto one end of the p-type semiconductor layer, and performing a firing treatment to diffuse the insulating material into the p-type semiconductor layer.

By this method, the insulating material can be easily diffused into the p-type semiconductor layer including the end of the internal electrode to cover one end of the internal electrode, and thus the end of the internal electrode can be easily insulated.

In addition, the method for producing an ultraviolet sensor according to the present invention includes an external electrode forming step of forming first and second external electrodes respectively by applying a second conductive paste onto the other end of the p-type semiconductor layer and an outer surface of the high-resistance layer, and performing a firing treatment, and the firing treatment in the external electrode forming step and the firing treatment in the high-resistance layer forming step are preferably carried out simultaneously to prepare the first and second external electrodes and the high-resistance layer simultaneously.

This method can produce ultraviolet sensors efficiently without substantially increase of the number of steps.

In addition, in the method for producing an ultraviolet sensor according to the present invention, a color former is preferably added into the insulating material in the high-resistance layer forming step.

This method can easily provide an ultraviolet sensor which is favorable for visually recognizing the orientation, and preferred for circuit implementation.

Furthermore, the method for producing an ultraviolet sensor according to the present invention is a method for producing an ultraviolet sensor, which includes: a green sheet preparing step of preparing a plurality of green sheets containing, as their main constituent, a solid solution of NiO and ZnO; a conductive film forming step of forming a conductive film to serve as an internal electrode; a laminated body preparing step of preparing a laminated body by stacking the plurality of green sheets in a form that sandwiches the conductive film; a p-type semiconductor layer forming step of forming a p-type semiconductor layer with an internal electrode buried therein by firing the laminated body; and an n-type semiconductor layer forming step of forming an n-type semiconductor layer on a surface of the p-type semiconductor layer by sputtering with, as a target, a ZnO sintered body containing ZnO as its main constituent, wherein in the conductive film forming step, a conductive powder is made into slurry, and then formed into a shape to prepare a conductive sheet as a sheet-like conductive film, and the method includes a high-resistance layer forming step of forming a high-resistance layer in a form that covers one end of the internal electrode, by applying an insulating paste comprising an insulating material onto one end of the p-type semiconductor layer, and performing a firing treatment to diffuse the insulating material into the p-type semiconductor layer.

This method makes it possible to obtain the laminated body by only sheet forming, without the need to form a conductive film by screen printing onto the green sheet.

In addition, the method for producing an ultraviolet sensor according to the present invention includes an external electrode forming step of forming first and second external electrodes by applying a second conductive paste onto the other end of the p-type semiconductor layer and an outer surface of the high-resistance layer, and performing a firing treatment, and the firing treatment in the external electrode forming step and the firing treatment in the high-resistance layer forming step are preferably carried out simultaneously to prepare the respective external electrodes and the high-resistance layer simultaneously.

In addition, in the method for producing an ultraviolet sensor according to the present invention, a color former is preferably added into the insulating material in the high-resistance layer forming step.

Furthermore, the method for producing an ultraviolet sensor according to the present invention is a method for producing an ultraviolet sensor, which includes: a green sheet preparing step of preparing a plurality of green sheets containing, as their main constituent, a solid solution of NiO and ZnO; a conductive film forming step of forming a conductive film to serve as an internal electrode; a laminated body preparing step of preparing a laminated body by stacking the plurality of green sheets in a form that sandwiches the conductive film; a p-type semiconductor layer forming step of forming a p-type semiconductor layer with an internal electrode buried therein by firing the laminated body; and an n-type semiconductor layer forming step of forming an n-type semiconductor layer on a surface of the p-type semiconductor layer by sputtering with, as a target, a ZnO sintered body containing ZnO as its main constituent, wherein in the conductive film forming step, a conductive powder is made into slurry, and then formed into a shape to prepare a conductive sheet as a sheet-like conductive film, and the method includes: a high-resistance layer forming step of forming high-resistance layers in a form that covers both ends of the internal electrode, by applying an insulating paste composed of an insulating material onto both ends of the p-type semiconductor layer, and performing a firing treatment to diffuse the insulating material into the p-type semiconductor layer; and an external electrode forming step of forming first and second external electrodes and third external electrodes by applying a second conductive paste onto outer surfaces of the high-resistance layers and side surfaces of the p-type semiconductor layer, and performing a firing treatment.

This method can easily provide a high-sensitivity three-terminal ultraviolet sensor which achieves the reduced variation in characteristics among products, and achieves further improved output current.

In addition, in the method for producing an ultraviolet sensor according to the present invention, the firing treatment in the external electrode forming step and the firing treatment in the high-resistance layer forming step are preferably carried out simultaneously to prepare the respective external electrodes and the high-resistance layer simultaneously.

In the ultraviolet sensor according to the present invention, the n-type semiconductor layer is joined to the p-type semiconductor layer in a form that exposes a portion of the p-type semiconductor layer at the surface, both ends of the internal electrode are exposed at both end surfaces of the p-type semiconductor layer, the high-resistance layer composed of an insulating material is formed so as to cover one end of the internal electrode, and the first external electrode is electrically connected to the other end of the internal electrode, whereas the second external electrode is electrically connected to the n-type semiconductor layer. Thus, the internal electrode is formed from one end surface of the p-type semiconductor layer to the other end surface thereof, thereby succeeding in suppressing the variation in dimension in the longitudinal direction of the internal electrode among products, and making it possible to reduce the variation in the overlap area formed between the internal electrode and the n-type semiconductor layer opposed thereto. More specifically, since the overlap area is stabilized, the variation in detection sensitivity to ultraviolet intensity among products can be suppressed, and thus it becomes possible to obtain a high-sensitivity ultraviolet sensor with favorable reliability. In addition, the high-resistance layer covering one end of the internal electrode thus makes the end of the internal electrode highly insulated, thereby suppressing the leakage current from the internal electrode to the second external electrode without ultraviolet irradiation, and making it possible to reduce the dark current, so that the sensor performance can be improved.

In addition, in the ultraviolet sensor according to the present invention, the internal electrode is exposed at both end surfaces and both side surfaces of the p-type semiconductor layer, the high-resistance layers composed of an insulating material are formed so as to cover both ends of the internal electrode, the first and second external electrodes are formed on the surfaces of the high-resistance layer, the n-type semiconductor layer is electrically connected to the first and second external electrodes, and the third external electrodes are formed on the side surfaces of the p-type semiconductor layer. Thus, in the case of a three-terminal ultraviolet sensor, also, the same operational advantage as described above can be achieved, and an ultraviolet sensor can be thus obtained which achieves the suppressed variation in characteristics among products. Moreover, in this case, since the effective distance can be shortened between external electrodes for extracting photovoltaic power, the output current can be further improved, and an ultraviolet sensor can be thus obtained which has further improved sensor performance. In addition, there is no need to consider the orientation in the case of mounting onto a circuit board.

Furthermore, according to the method for producing an ultraviolet sensor of the present invention, in the conductive film forming step, the conductive film is formed by applying a first conductive paste between both end surfaces of one of the green sheets, and the method includes the high-resistance layer forming step of forming a high-resistance layer in a form that covers one end of the internal electrode, by applying the insulating paste composed of an insulating material onto one end of the p-type semiconductor layer, and performing a firing treatment to diffuse the insulating material into the p-type semiconductor layer. Thus, the insulating material can be easily diffused into the p-type semiconductor layer including the end of the internal electrode to cover one end of the internal electrode, and thereby easily provide the insulated end of the internal electrode.

In addition, according to the method for producing an ultraviolet sensor of the present invention, in the conductive film forming step, the conductive powder is made into slurry, and then formed into a shape to prepare a conductive sheet as a sheet-like conductive film, and the method includes a high-resistance layer forming step of forming a high-resistance layer in a form that covers one end of the internal electrode, by applying the insulating paste composed of an insulating material onto one end of the p-type semiconductor layer, and performing a firing treatment to diffuse the insulating material into the p-type semiconductor layer. Thus, this method makes it possible to obtain the laminated body by only sheet forming, without the need to form a conductive film by screen printing onto the green sheet. More specifically, in this case, the conductive film which is formed by a sheet method can be thus formed as a thicker film, as compared with a printing method, and as a result, the internal electrode undergoes a decrease in resistance, thereby also improving the output current, and improving the sensor performance.

In addition, according to the method for producing an ultraviolet sensor of the present invention, in the conductive film forming step, the conductive powder is made into slurry, and then formed into a shape to prepare a conductive sheet as a sheet-like conductive film, and the method includes: a high-resistance layer forming step of forming high-resistance layers in a form that covers both ends of the internal electrode, by applying the insulating paste composed of an insulating material onto both ends of the p-type semiconductor layer, and performing a firing treatment to diffuse the insulating material into the p-type semiconductor layer; and an external electrode forming step of forming first and second external electrodes and third external electrodes by applying the second conductive paste onto the outer surfaces of the high-resistance layers and the side surfaces of the p-type semiconductor layer, and performing the firing treatment. Thus, a high-sensitivity three-terminal ultraviolet sensor can be easily obtained which achieves reduced variation in characteristics among products, and achieves further improved output current.

DETAILED DESCRIPTION OF THE INVENTION

Next, embodiments of the present invention will be described in detail with reference to accompanying drawings.

Figure 1:
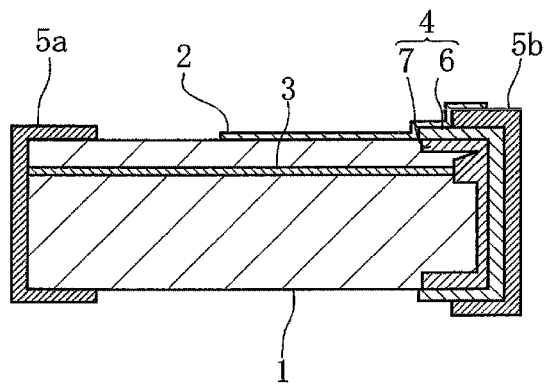
FIG. 1 is a vertical cross-sectional view schematically illustrating an embodiment (first embodiment) of an ultraviolet sensor according to the present invention.
Figure 2:
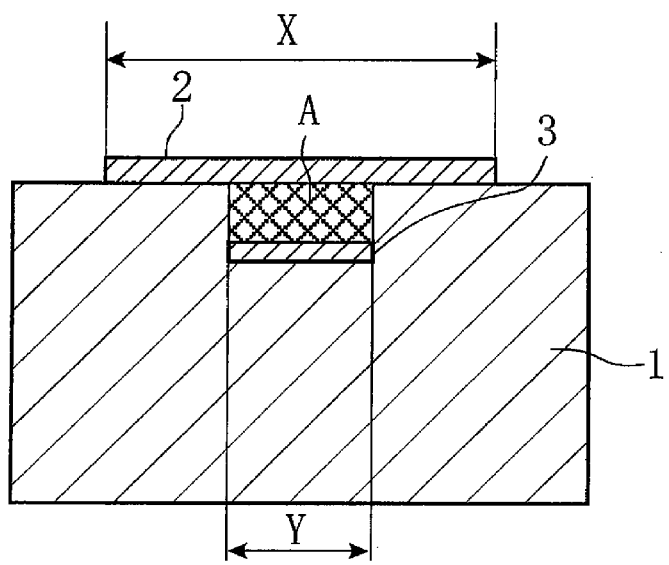
FIG. 2 is a transverse cross-sectional view of a main section of the first embodiment.

FIG. 1 is a vertical cross-sectional view schematically illustrating an embodiment (first embodiment) of an ultraviolet sensor according to the present invention, and FIG. 2 is a transverse cross-sectional view of a main section in FIG. 1.

This ultraviolet sensor has a p-type semiconductor layer 1 containing, as its main constituent, a solid solution of NiO and ZnO, and an n-type semiconductor layer 2 containing ZnO as its main constituent, and the n-type semiconductor layer 2 is joined to the p-type semiconductor layer 1 in a form that exposes a portion of the surface of the p-type semiconductor layer 1.

The p-type semiconductor layer 1 contains, as its main constituent, the solid solution of NiO and ZnO as described above, which can be represented by the general formula $(Ni_{1-x}Zn_x)O$ (hereinafter, referred to as (Ni, Zn)O).

The compounding molar ratio x of Zn is preferably $0.2 \leq x \leq 0.4$ in order for the p-type semiconductor layer 1 to achieve a desired function. This is because if x is less than 0.2, there is a possibility the Ni content will be excessively increased to increase the resistance, whereas if x is greater than 0.4, there is a possibility that the Zn content will be excessively increased to deposit ZnO grains at crystal grain boundaries, and convert the (Ni, Zn)O to an n-type semiconductor. Further, the p-type semiconductor layer 1 may contain minute amounts of other additives, and for example, contain Fe, Mn, etc. as a diffusing agent. In addition, even if minute amounts of Zr, Si, etc. are contained as impurities, they will not affect the characteristics.

The n-type semiconductor layer 2 preferably contains Al, Co, In, Ga, etc., as minute amounts of additives, for example, a doping agent, as long as the main constituent is ZnO, and such a doping agent contained imparts conductivity to promote the conversion to the n-type semiconductor. In addition, this n-type semiconductor layer 2 may also contain Fe, Ni, Mn, etc., for example, as a diffusing agent, as in the case of the p-type semiconductor layer 1, and even if minute amounts of Zr, Si, etc. are contained as impurities, they will not affect the characteristics.

An internal electrode 3 is buried in an upper section of the p-type semiconductor layer 1. Both ends of the internal electrode 3 are exposed at both end surfaces of the p-type semiconductor layer 1, and a high-resistance layer 4 composed of an insulating material is formed so as to cover one end of the internal electrode 3.

Further, a first external electrode 5a is electrically connected to the other end of the internal electrode 3, whereas a second external electrode 5b is electrically connected to the n-type semiconductor layer 2. It is to be noted that the first and second external electrodes 5a, 5b are formed of Ag, Ag—Pd, or the like, and although not shown, a first plating film composed of Ni or the like and a second plating film composed of Sn or the like are formed sequentially on the surfaces of the first and second external electrodes 5a, 5b to thereby constitute terminal electrodes.

The high-resistance layer 4 has a first high-resistance layer 6 composed of the insulating material, which is interposed between the second external electrode 5b and the p-type semiconductor layer 1, and a second high-resistance layer 7 of the insulating material diffused into the p-type semiconductor layer 1 so as to cover one end of the internal electrode 3.

Further, the internal electrode 3 is formed from a low-resistance composite oxide containing an oxide of a perovskite-type structure represented by the general formula $RNiO_3$ or an oxide represented by the general formula $R_2NiO_4$, which contains a rare earth element R and Ni as its main constituents.

More specifically, the composite oxide containing a rare earth element R and Ni as its main constituents is a Ni-based oxide as with (Ni, Zn)O, and both the composite oxide and (Ni, Zn)O, which are close in energy level to each other, can prevent an unnecessary Schottky barrier from being formed between the composite oxide and the (Ni, Zn)O, thus nearly becoming in ohmic contact with each other. In addition, the rare-earth element is less likely to be diffused to the (Ni, Zn)O side as compared with Ni, and has no oxygen-releasing action, unlike Pd, thus making it possible to decrease the resistivity of the (Ni, Zn)O. Moreover, the composite oxide containing, as its main constituents, a rare earth element R and Ni is a Ni-based oxide as with (Ni, Zn)O as described above, thus close to the (Ni, Zn)O in shrinkage behavior at elevated temperatures, is less likely to cause delamination between the p-type semiconductor layer 1 and the internal electrode 3, and also is not a cause of such a phenomenon as the electrode drawn into the sintered body.

Thus, the internal electrode 3 containing the rare-earth element R and Ni as its main constituents can decrease the resistivity of the (Ni, Zn)O. Therefore, there is no need to detect changes in resistance value for ultraviolet intensity by providing a power circuit outside, thereby making it possible to directly detect desired large photocurrent.

Moreover, the internal electrode 3 formed from the composite oxide as described above thereby makes it easier for the insulating material to diffuse into crystal grain boundaries on the surfaces of the internal electrode 3, unlike in the case of formation from a single element metal. In particular, the surfaces of the internal electrode 3 parallel to the n-type semiconductor layer 2 have more pores than the surfaces thereof perpendicular to the layer, thereby making the diffusion easier. Thus, the internal electrode formed from the composite oxide easily diffuses the insulating material into the end of the internal electrode 3 and into the p-type semiconductor layer 1 near the end, thereby easily increasing the resistance at the end of the internal electrode 3 and in a region near the end. As a result, it becomes possible to effectively reduce the leakage current from the internal electrode 3 to the second external electrode 5b without ultraviolet irradiation, and it thus becomes possible to achieve the reduction in dark current.

In addition, in this case, the use of an expensive noble metal material such as Pt and Pd is eliminated, thus making it possible to suppress an increase in price.

For the reason mentioned above, in the present embodiment, the internal electrode 3 is formed from a low-resistance composite oxide containing an oxide of a perovskite-type structure represented by the general formula $RNiO_3$ or an oxide represented by the general formula $R_2NiO_4$, which contains a rare earth element R and Ni as its main constituents.

Such a rare earth element is not particularly limited as long as a low resistance is achieved when the element forms a composite oxide with Ni, and for example, at least one selected from among La, Pr, Nd, Sm, Gd, Dy, Ho, Er and Yb may be used. Further, among these elements, inexpensive La is preferably used for reason of economics.

The width dimension X of the n-type semiconductor layer 2 along the end surface of the p-type semiconductor layer 1 is then made larger than the width dimension Y of the internal electrode 3 provided to be opposed to the n-type semiconductor layer 2, as shown in FIG. 2. This makes it possible for the n-type semiconductor layer 2 to absorb not only the variation in the longitudinal direction of the internal electrode 3 but also the variation in the width direction thereof. More specifically, the area (overlap area) of the overlap (denoted by "A" in FIG. 2) between the internal electrode 3 and the n-type semiconductor layer 2 provided to be opposed to each other is stabilized among products, thereby making it possible to suppress the variation in characteristics among products.

Thus, in the present embodiment, the both ends of the internal electrode 3 are exposed at the both end surfaces of the p-type semiconductor layer 1, and the high-resistance layer 4 (the first and second high-resistance layers 6, 7) is formed so as to cover one end of the internal electrode 3. Thus, the overlap area between the internal electrode 3 and the n-type semiconductor layer 2 provided to be opposed to each other is stabilized among products, and an ultraviolet sensor can be obtained which achieves the suppressed variation in characteristics, and has the ability to detect photovoltaic power with favorable reliability.

In addition, as described above, because of having the high-resistance layer 4 (the first and second high-resistance layers 6, 7), the insulation is improved at the end of the internal electrode 3 and near the end, so that the leakage current from the internal electrode 3 to the second external electrode 5b without ultraviolet irradiation can be thus suppressed, thereby making it possible to achieve the reduction in dark current.

In addition, in the case of mounting the ultraviolet sensor onto a circuit board, there is typically a need for orientation selection, and a color former is thus also preferably contained in the high-resistance layer 4 for the achievement of coloring. This coloring makes it easy to check the orientation of the product. For example, containing $Co_2O_3$ makes the high-resistance layer 4 blackish, whereas containing $Al_2O_3$ makes the high-resistance layer 4 whitish. Therefore, the high-resistance layer 4 containing such a color former makes it easy to visually recognize the orientation.

It is to be noted that while the insulating material forming the high-resistance layer 4 is not particularly limited as long as the material reacts with the (Ni, Zn)O forming the p-type semiconductor layer 1 to some extent, and serves as an insulator or a high-resistance body which can be joined to the (Ni, Zn)O, insulating glass materials such as Si—B—Bi—Zn based glass materials can be preferably used.

Next, a method for producing the above-mentioned ultraviolet sensor will be described in detail.

[Preparation of ZnO Sintered Body]

A ZnO powder, various types of doping agents, and if necessary, additives such as a diffusing agent are prepared and weighed in predetermined amounts. Then, these weighed compounds are, with the addition of a solvent such as pure water thereto, adequately subjected to mixing and grinding in a wet manner by using a ball mill with balls such as PSZ (partially stabilized zirconia) as a grinding medium to obtain a slurry-like mixture. Subsequently, this slurry-like mixture is dehydrated and dried, then granulated so as to have a predetermined particle diameter, and thereafter, subjected to calcination at a predetermined temperature for about 2 hours to obtain a calcined powder. Next, the calcined powder thus obtained is, again with the addition of a solvent such as pure water thereto, adequately subjected to grinding in a wet manner by using a ball mill with balls as a grinding medium to obtain a slurry-like ground product. Next, this slurry-like ground product is dehydrated and dried, and then with the addition of pure water, a dispersant, a binder, a plasticizer and the like thereto, a slurry for forming is prepared. Thereafter, the slurry for forming is subjected to a forming process by using a method of forming such as a doctor blade method, to prepare ZnO green sheets with a predetermined film thickness. Subsequently, the ZnO green sheets are stacked a predetermined number of times, and subjected to pressure bonding to prepare a pressure-bonded product. Then, this pressure-bonded product is subjected to degreasing, and then firing to obtain a ZnO sintered body.

[Preparation of (Ni, Zn)O Green Sheet]

A NiO powder and a ZnO powder are weighed so that the compounding molar ratio x of Zn is 0.2 to 0.4, and these weighed powders are, with the addition of a solvent such as pure water thereto, adequately subjected to mixing and grinding in a wet manner in a ball mill with balls as a grinding medium to obtain a slurry-like mixture. Subsequently, this mixture is dehydrated, dried, granulated so as to have a predetermined particle diameter, and then subjected to calcination at a predetermined temperature for about 2 hours to obtain a calcined powder. Next, the calcined powder thus obtained is, again with the addition of a solvent such as pure water thereto, adequately subjected to grinding in a wet manner in a ball mill with balls as a grinding medium to obtain a slurry-like ground product. Next, this slurry-like ground product is dehydrated and dried, and then with the addition of an organic solvent, a dispersant, a binder, a plasticizer and the like thereto, a slurry for forming is prepared. Subsequently, the slurry for forming is subjected to a forming process by using a method of forming such as a doctor blade method, thereby providing a (Ni, Zn)O green sheet with a predetermined film thickness.

[Preparation of Conductive Paste for Formation of Internal Electrode (First Conductive Paste)]

A NiO powder and a $R_2O_3$ powder (R: rare-earth element) are weighed so that the molar ratio was 2:1, and these weighed compounds are, with the addition of a solvent such as pure water thereto, adequately subjected to mixing and grinding in a wet manner in a ball mill with balls as a grinding medium to obtain a slurry-like mixture. Subsequently, this slurry-like mixture is dehydrated and dried, granulated so as to have a predetermined particle diameter, and then subjected to calcination at a predetermined temperature for about 2 hours to obtain a calcined powder. Next, the calcined powder thus obtained is, again with the addition of a solvent such as pure water thereto, adequately subjected to grinding in a wet manner in a ball mill with balls as a grinding medium to obtain a slurry-like ground product. Next, this slurry-like ground product is dehydrated and dried to obtain a composite oxide powder containing an oxide represented by the general formula $RNiO_3$ or the general formula $R_2NiO_4$. Then, the obtained composite oxide powder is mixed with an organic vehicle, and kneaded with a three-roll mill to thereby prepare a conductive paste for the formation of an internal electrode.

It is to be noted that the organic vehicle is obtained by dissolving a binder resin in an organic solvent, and the binder resin and the organic solvent are prepared so as to achieve 1 to 3:7 to 9, for example, in terms of a volume ratio. The binder resin is not particularly limited, and for example, an ethyl cellulose resin, a nitrocellulose resin, an acrylic resin, an alkyd resin, or a combination of these resins can be used. Furthermore, the organic solvent is also not particularly limited, and α-terpineol, xylene, toluene, diethylene glycol monobutyl ether, diethylene glycol monobutyl ether acetate, diethylene glycol monoethyl ether, and diethylene glycol monoethyl ether acetate can be used either alone or in combination.

[Preparation of Insulating Paste]

An insulating material such as a B—Si—Zn—Bi based glass material is prepared, a color former such as $Co_2O_3$ and $Al_2O_3$ is then added to the insulating material, if necessary, and this material is mixed with an organic vehicle, and kneaded with a three-roll mill, thereby preparing an insulating paste. It is to be noted that the same organic vehicle can be used as used in the preparation of the conductive paste for the formation of an internal electrode.

[Preparation of Laminated Body]

Figure 3:
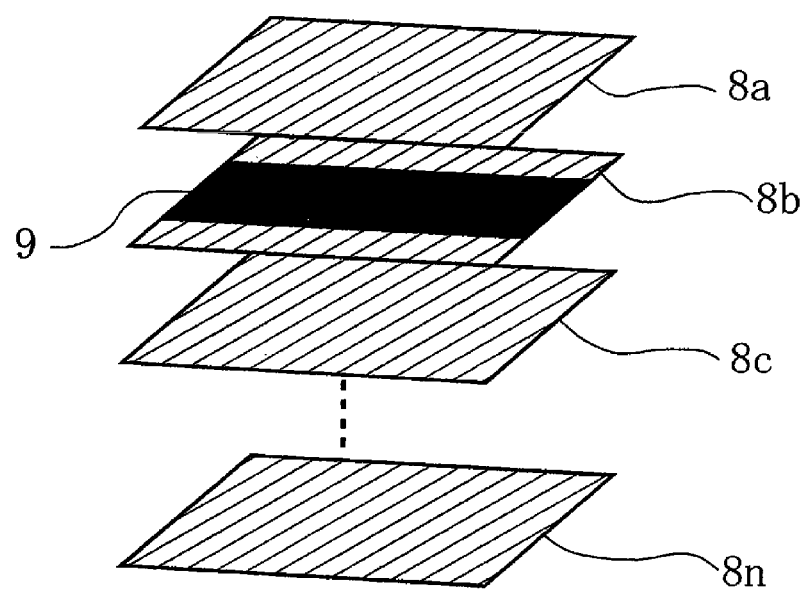
FIG. 3 is an exploded perspective view of an unfired laminated body in the first embodiment.

A method for preparing a laminated body will be described with reference to FIG. 3.

First, a predetermined number of (Ni, Zn)O green sheets 8a, 8b, 8c, . . . , 8n are prepared, the conductive paste for the formation of an internal electrode is applied between both end surfaces of one of the (Ni, Zn)O green sheets, the (Ni, Zn)O green sheet 8b, to form an internal conductive film 9.

Next, a predetermined number of (Ni, Zn)O green sheets 8c to 8n with no conductive film formed are stacked, the (Ni, Zn)O green sheet 8b with the internal conductive film 9 formed is stacked thereon, and further, the (Ni, Zn)O green sheet 8a with no conductive film formed is stacked thereon, and these sheets are subjected to pressure bonding to prepare a laminated body.

[Preparation of p-Type Semiconductor Layer 1]

The laminated body is adequately subjected to degreasing at a temperature of 300 to 500° C., and then to firing at a temperature around 1200° C. to co-fire the conductive film 9 and the (Ni, Zn)O green sheets 8a to 8n, thereby providing a p-type semiconductor layer 1 with an internal electrode 3 embedded therein.

[Preparation of High-Resistance Layer 4 and First and Second External Electrodes 5a, 5b]

Figure 4:
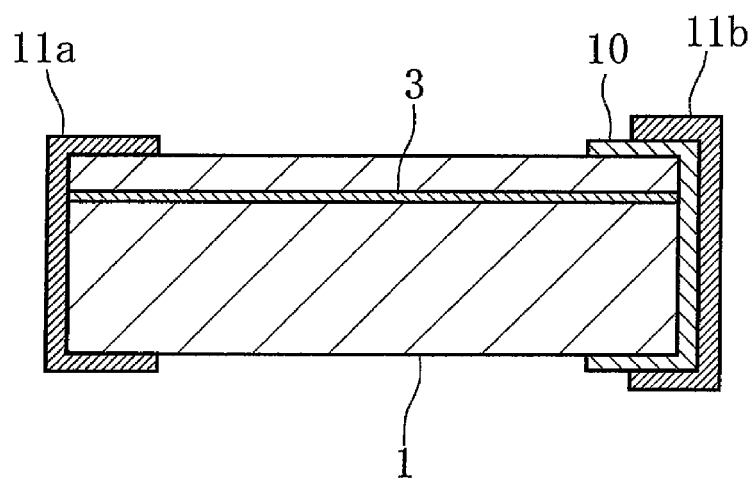
FIG. 4 is a vertical cross-sectional view illustrating a conductive paste for an internal electrode and an insulating paste applied to the p-type semiconductor layer in FIG. 1.

As shown in FIG. 4, the insulating paste is applied onto one end surface of the p-type semiconductor layer 1 to form an insulating coating film 10, and a conductive paste for the formation of external electrodes (second conductive paste) is further applied onto the other end surface of the p-type semiconductor layer 1 and the outer surface of the insulating coating film 10 to form first and second external conductive films 11a, 11b. Then, these films are subjected to a firing treatment, thereby forming first and second external electrodes 5a, 5b, and forming a high-resistance layer 4 (first and second high-resistance layers 6, 7) through diffusion of the insulating coating film 10 to the p-type semiconductor layer 1 including the end of the internal electrode 3. It is to be noted that the conductive material of the paste for the formation of external electrodes is not particularly limited as long as the material has favorable electric conductivity, and Ag, Ag—Pd and the like can be used as the conductive material.

[Preparation of Terminal Electrode]

The first and second external electrodes 5a, 5b are subjected to electrolytic plating to form a plating film which has a two-layer structure composed of a first plating film and a second plating film, thereby forming terminal electrodes.

[Formation of n-Type Semiconductor Layer 2]

With a ZnO sintered body as a target, sputtering is performed through a metal mask with a predetermined opening to form an n-type semiconductor layer 2 composed of a ZnO-based thin film on the surface of the p-type semiconductor layer 1 so as to partially expose the p-type semiconductor layer 1 at the surface, and to be electrically connected to the external electrode 5b, thereby providing an ultraviolet sensor.

As described above, in the method for producing an ultraviolet sensor, the conductive paste for the formation of an internal electrode is applied between the both end surfaces of the green sheet 8b among the plurality of green sheets 8a to 8n to form the conductive film 9, and the insulating paste is applied onto one end of the p-type semiconductor layer 1, and subjected to a firing treatment to diffuse the insulating material into the p-type semiconductor layer 1, and thereby form the high-resistance layer 4 (first and second high-resistance layers 6, 7) in a manner that covers one end of the internal electrode 3. Thus, the insulation is improved at one end of the internal electrode 3 and around the end, so that the leakage current without ultraviolet irradiation is suppressed to decrease the dark current.

Moreover, in the embodiment described above, since the internal electrode 3 is formed from a composite oxide rather than a single element metal, the insulating material is likely to diffuse into crystal grain boundaries in the internal electrode 3 as described above, and in particular, the surfaces of the internal electrode 3 parallel to the n-type semiconductor layer 2 have more pores than the surfaces thereof perpendicular to the layer, thereby making the diffusion easier. For this reason, the insulating material easily diffuses into the end of the internal electrode 3 and the p-type semiconductor layer 1 near the end, thereby easily increasing the resistance at the end of the internal electrode 3 and in a region near the end. As a result, the leakage current from the internal electrode 3 to the second external electrode 5b without ultraviolet irradiation can be reduced, thereby succeeding in more effectively suppressing the dark current, and in achieving an ultraviolet sensor which has favorable sensor performance.

Figure 5:
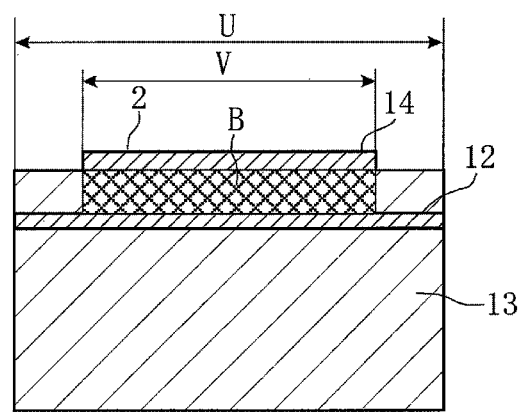
FIG. 5 is a transverse cross-sectional view of a main section of a second embodiment of the ultraviolet sensor according to the present invention.

FIG. 5 is a transverse cross-sectional view illustrating a main section of a second embodiment of the ultraviolet sensor.

In this second embodiment, an internal electrode 12 is buried in a p-type semiconductor layer 13 so that the plane area of a principal surface of the internal electrode 12 is equal to the plane area of a principal surface of the p-type semiconductor layer 13.

More specifically, in this second embodiment, the width dimension U of the internal electrode along the end surface of the p-type semiconductor layer 13 is made larger than the width dimension V of the n-type semiconductor layer 14 provided to be opposed to the internal electrode 12.

In the second embodiment, since as described above, the width dimension U of the internal electrode along the end surface of the p-type semiconductor layer 13 is made larger than the width dimension V of the n-type semiconductor layer 14 provided to be opposed to the internal electrode 12, the area of an overlap denoted by B in the figure, that is, the overlap area can be increased, even when the n-type semiconductor layer 14 varies in dimension. Therefore, the increased overlap area makes it possible to stabilize the photovoltaic power with respect to ultraviolet irradiation, and achieve a further improvement in response intensity.

Figure 6:
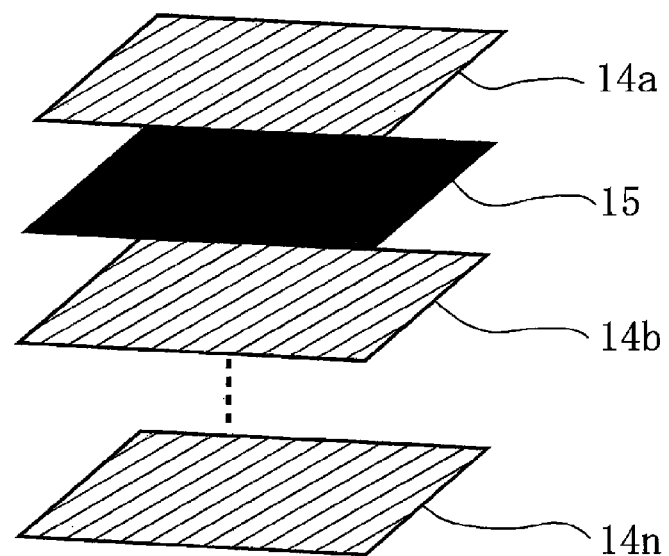
FIG. 6 is an exploded perspective view of an unfired laminated body according to the second embodiment.

In this second embodiment, a laminated body can be easily prepared as shown in FIG. 6.

More specifically, first, (Ni, Zn)O green sheets 14a, 14b, . . . , 14n are prepared in accordance with the same method and procedure as in the first embodiment.

Then, a composite oxide powder containing an oxide represented by the general formula $RNiO_3$ or the general formula $R_2NiO_4$ is prepared in the same way as in the first embodiment.

Then, the composite oxide powder is, again with the addition of pure water thereto, adequately subjected to mixing and grinding in a ball mill with a grinding medium, thereby providing a mixture. Next, this mixture is dehydrated and dried, then an organic solvent and a dispersant are added thereto and mixed, and further a binder and a plasticizer are appropriately added thereto to prepare a slurry, and a doctor blade method is applied to the slurry to prepare a conductive sheet with a predetermined thickness.

Next, the predetermined number of (Ni, Zn)O green sheets 14b to 14n are stacked, the conductive sheet 15 as a conductive film is stacked thereon, further, the (Ni, Zn)O green sheet 14a is stacked thereon, and these sheets are subjected to pressure bonding to prepare a laminated body.

Thereafter, this laminated body is subjected to firing under the same condition as in the first embodiment, thereby succeeding in obtaining the p-type semiconductor layer 13 with the internal electrode 12 buried therein.

It is to be noted that the ultraviolet sensor according to the second embodiment can be prepared, as for the other steps, in accordance with the same method and procedure as in the first embodiment.

In the second embodiment, since the conductive powder is made into slurry, and then formed into a shape to prepare the conductive sheet 15 as a conductive film as described above, the ultraviolet sensor can be easily produced without the need to form a conductive film in a predetermined pattern by screen printing onto the (Ni, Zn)O green sheet. Moreover, the conductive sheet 15 as a conductive film is formed by the sheet method, and thus can be formed as a thicker film as compared with printing methods. Therefore, the internal electrode 12 undergoes a decrease in resistance, and as a result, the output current is increased, thereby making it possible to improve the sensor performance.

Figure 7:
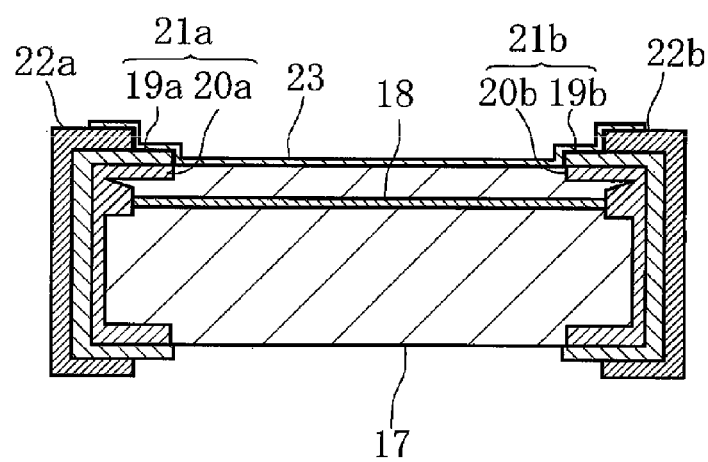
FIG. 7 is a vertical cross-sectional view of a third embodiment of the ultraviolet sensor according to the present invention.
Figure 8:
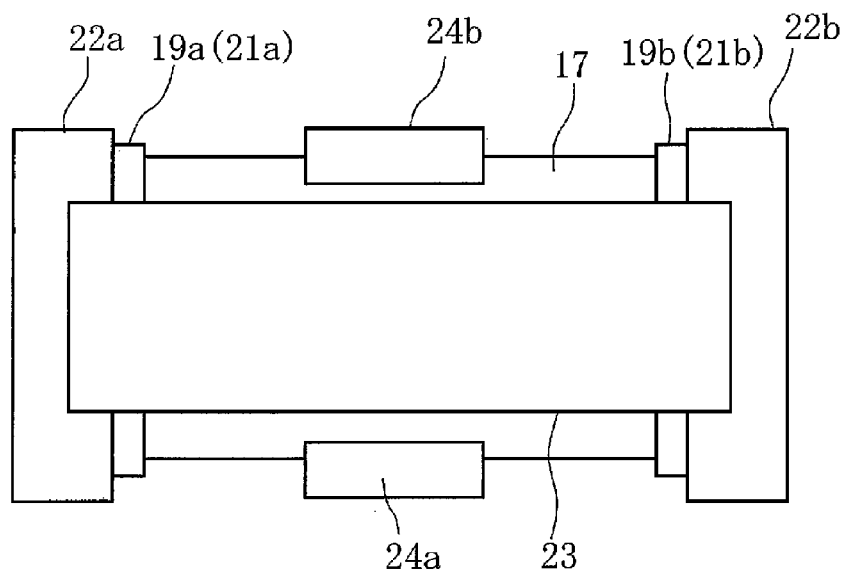
FIG. 8 is a plan view schematically illustrating the third embodiment.
Figure 9:
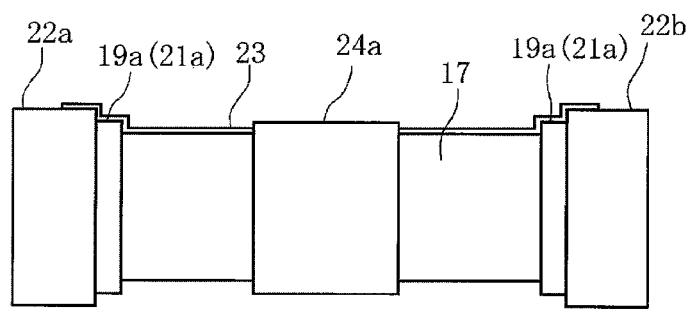
FIG. 9 is a front view schematically illustrating the third embodiment.

FIG. 7 is a vertical cross-sectional view illustrating a third embodiment. Furthermore, FIG. 8 is a plan view of the third embodiment, and FIG. 9 is a front view of the third embodiment.

In this third embodiment, as in the second embodiment, an internal electrode 18 is included which has a principal surface equal to a p-type semiconductor layer 17 in plane area, high-resistance layers 21a, 21b composed of first high-resistance layers 19a, 19b and second high-resistance layers 20a, 20b are formed on both ends of the internal electrodes 18, and further, first and second external electrodes 22a, 22b are formed on the outer surfaces of the first high-resistance layers 19a, 19b. In addition, in an n-type semiconductor layer 23, a bridge between the first external electrode 22a and the second external electrode 22b is formed, and third electrodes 24a, 24b are formed on both side surfaces of the p-type semiconductor layer 17, so that the third electrodes 24a, 24b are electrically connected to the internal electrode 18.

In this third embodiment, in addition to the advantage effects achieved by the second embodiment, photocurrent can be also detected between the first external electrode 22a and the third external electrodes 24a, 24b, or between the second external electrode 22b and the third external electrodes 24a, 24b, thereby allowing for a non-orientation structure even after mounting onto a circuit board. Moreover, the effective distance between the external electrodes for detecting the photocurrent is also reduced to decrease the resistance, and thus make it possible to achieve a further improvement in response sensitivity to ultraviolet intensity.

FIGS. 10(a) to 10(d) are diagrams illustrating a production method according to the third embodiment.

First, a p-type semiconductor layer 17 with an internal electrode 18 buried therein is prepared in accordance with the same method and procedure as in the second embodiment.

Then, an insulating paste is prepared in accordance with the same method and procedure as in the first embodiment.

Figure 10A:
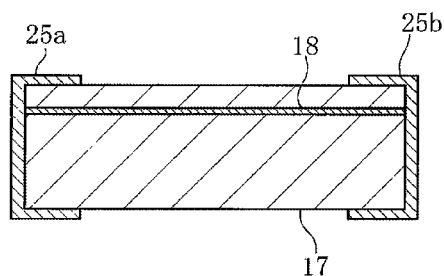
FIGS. 10(a) to 10(d) are production process drawings for explaining a production method for according to the third embodiment.

Then, as shown in FIG. 10(a), the insulating paste is applied onto both ends of the p-type semiconductor layer 17 to form insulating coating films 25a, 25b.

Figure 10B:
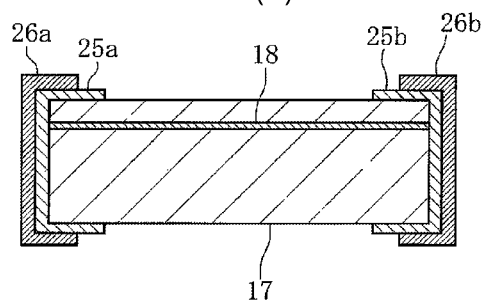

Then, as shown in FIG. 10(b), a conductive paste for external electrodes is applied onto the outer surfaces of the insulating coating films 25a, 25b to form external conductive films 26a, 26b, and further, the conductive paste for external electrodes is also applied onto both side surfaces of the p-type semiconductor layer 17 to form third external conductive films (not shown).

Figure 10C:
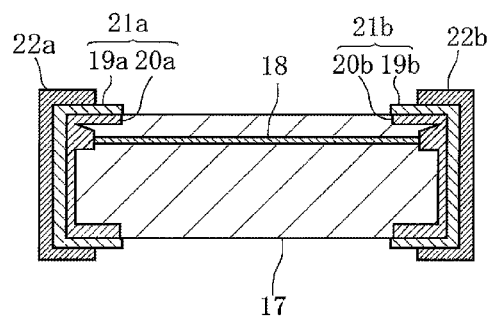

After this, a firing treatment is performed in the same way as in the first embodiment. Then, the insulating coating films 25a, 25b diffuse into the p-type semiconductor layer 17 to form high-resistance layers 21a, 21b (first high-resistance layers 19a, 19b and second high-resistance layers 20a, 20b) at the same time as the formation of first and second external electrodes 22a, 22b and third external electrodes, as shown in FIG. 10(c). Thereafter, the surfaces of the first and second external electrodes 22a, 22b and the third external electrodes are subjected to electrolytic plating to form plating films, not shown.

Figure 10D:
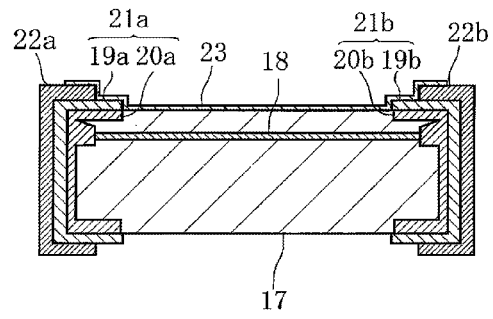

Then, subsequently in the same way as in the first embodiment, sputtering is performed with a ZnO sintered body as a target so as to form a bridge between the first external electrode 22a and the second external electrode 22b, for preparing an n-type semiconductor layer 23 as shown in FIG. 10(d), thereby preparing a three-terminal ultraviolet sensor.

In the third embodiment as described above, the effective distance between the external electrodes for detecting photocurrent is shorter as compared with in the first and second embodiments, and an ultraviolet sensor with favorable reliability can be thus easily obtained which is more favorable in terms of response intensity to ultraviolet intensity with low dark current.

It is to be noted that the present invention should not be considered limited to the embodiments described above. While the insulating coating films and the external conductive films are subjected to co-firing to obtain the high-resistance layers 4, 21a, 21b and the external electrodes 5a, 5b, 22a, 22b in the embodiments, the films may be subjected to firing separately.

In addition, while the first high-resistance layers 6, 19a, 19b are formed on the end surfaces of the p-type semiconductor layers 1, 17 and folded areas in the end surfaces in the respective embodiments, the first high-resistance layers may be formed only on the end surfaces because a desired improvement in insulation can be achieved as long as the ends of the internal electrodes 3, 18 can be covered.

In addition, while the internal electrode 3 is formed by preparing the conductive paste for the formation of an internal electrode, which contains a composite oxide, applying the conductive paste for the formation of an internal electrode onto the surface of the (Ni, Zn)O green sheet, and then firing the conductive paste in the embodiment, a desired internal electrode can be formed also by preparing a rare earth paste with a main constituent composed of a rare-earth oxide $R_2O_3$ without Ni contained in the paste for the formation of an internal electrode, and diffusing Ni in the (Ni, Zn)O green sheet to the rare-earth film during firing treatment.

Next, examples of the present invention will be described in detail.

EXAMPLE

[Preparation of Sample]
(Sample Number 1)
[Preparation of ZnO Sintered Body]

ZnO as a main constituent and $Ga_2O_3$ as a doping agent were weighed for compounding ratios of 99.9 mol % and 0.1 mol % respectively in terms of mol %. Then, these weighed compounds were, with the addition of pure water thereto, subjected to mixing and grinding in a ball mill with PSZ beads as a grinding medium to obtain a slurry-like mixture of 0.5 μm or less in average particle diameter. Subsequently, this slurry-like mixture was dehydrated and dried, granulated so as to have a particle diameter on the order of 50 μm, and then subjected to calcination at a temperature of 1200° C. for 2 hours to obtain a calcined powder.

Next, the calcined powder thus obtained was, again with the addition of pure water thereto, subjected to mixing and grinding in a ball mill with PSZ beads as a grinding medium to obtain a slurry-like ground product of 0.5 μm in average particle diameter. Next, the slurry-like ground product was dehydrated and dried, then pure water and a dispersant were added thereto and mixed together, and further a binder and a plasticizer were added thereto to prepare a slurry for forming, from which green sheets of 20 μm in thickness were prepared by using a doctor blade method. Subsequently, these green sheets were stacked a predetermined number of times so as to have a thickness of 20 mm, and subjected to a pressure bonding treatment for 5 minutes at a pressure of 250 MPa to obtain a pressure-bonded body. Then, this pressure-bonded body was subjected to degreasing, and then to firing at a temperature of 1200° C. for 20 hours to obtain a ZnO sintered body.

[Preparation of (Ni, Zn)O Green Sheet]

A NiO powder and a ZnO powder were weighed so that the molar ratio was 7:3, and with the addition of pure water thereto, subjected to mixing and grinding in a ball mill with PSZ beads as a grinding medium to obtain a slurry-like mixture. Subsequently, this slurry-like mixture was dehydrated and dried, granulated so as to have a particle diameter on the order of 50 μm, and then subjected to calcination at a temperature of 1200° C. for 2 hours to obtain a calcined powder. Next, the calcined powder thus obtained was, again with the addition of pure water thereto, subjected to grinding in a ball mill with PSZ beads as a grinding medium to obtain a slurry-like ground product of 0.5 μm in average particle diameter. Next, the slurry-like ground product was dehydrated and dried, then an organic solvent and a dispersant were added thereto and mixed together, and further a binder and a plasticizer were added thereto to prepare a slurry for forming. Then, this slurry for forming was subjected to a forming process using a doctor blade method to obtain (Ni, Zn)O green sheets of 10 μm in film thickness.

[Preparation of Conductive Paste for Formation of Internal Electrode]

A NiO powder and a $La_2O_3$ powder as a rare-earth oxide were each weighed so that the molar ratio was 2:1, and with the addition of pure water to these weighed compounds, subjected to mixing and grinding in a ball mill with PSZ beads as a grinding medium to obtain a slurry-like mixture. Subsequently, this slurry-like mixture was dehydrated and dried, granulated so as to have a particle diameter on the order of 50 μm, and then subjected to calcination at a temperature of 1200° C. for 2 hours to obtain a calcined powder. Next, the calcined powder thus obtained was, again with the addition of pure water thereto, subjected to grinding in a ball mill with PSZ beads as a grinding medium to obtain a slurry-like ground product of 0.5 μm in average particle diameter. Then, this slurry-like ground product was dehydrated and dried to obtain a $LaNiO_3$ powder. Then, the obtained $LaNiO_3$ powder was mixed with an organic vehicle, and kneaded with a three-roll mill to thereby prepare a conductive paste for the formation of an internal electrode.

It is to be noted that the organic vehicle was prepared by mixing an ethyl cellulose resin and α-terpineol so that the ethyl cellulose resin as a binder resin was 30 vol %, whereas the α-terpineol as an organic solvent was 70 vol %.

[Preparation of Insulating Paste]

Prepared were a $B_2O_3$—$SiO_2$—$ZnO$—$Bi_2O_3$ based glass powder and a $BaTiO_3$ powder. Then, the glass powder and the $BaTiO_3$ powder were blended so that the ratio by weight was 9:1, mixed with an organic vehicle composed of 30 vol % of an ethyl cellulose resin as a binder resin and 70 vol % of α-terpineol as an organic solvent, and kneaded with a three-roll mill to thereby prepare an insulating paste.

[Preparation of Laminated Body]

For one of the (Ni, Zn)O green sheets, the conductive paste for the formation of an internal electrode was applied between both end surfaces by screen printing, and dried at a temperature of 60° C. for 1 hour to form a conductive film.

Subsequently, twenty (Ni, Zn)O green sheets with no conductive film formed were stacked, and the (Ni, Zn)O green sheet with the conductive film formed was stacked thereon, and further, one (Ni, Zn)O green sheet with no conductive film formed was stacked thereon sequentially. Then, these sheets were subjected to pressure bonding at a pressure of 200 MPa, and then cut into a size of 2.5 mm×1.5 mm to thereby prepare a laminated body.

[Preparation of p-Type Semiconductor Layer]

The laminated body was placed on a setter made of $ZrO_2$ and put in a firing furnace, and subjected to degreasing slowly and adequately at a temperature of 300° C., and then to firing at a temperature of 1200° C. for 1 hour in the atmosphere, thereby providing a p-type semiconductor layer.

[Preparation of High-Resistance Layer and External Electrode]

The insulating paste was applied onto one end of the p-type semiconductor layer 1 to form an insulating coating film, and further, an Ag—Pd paste (Ag/Pd=95/5) was applied onto the other end of the p-type semiconductor layer and the outer surface of the insulating coating film. Subsequently, a firing treatment was carried out at a temperature of 850° C. for 10 minutes. Then, the insulating coating film diffuses into the p-type semiconductor layer to provide a high-resistance layer at the same time as the formation of first and second external electrodes.

[Preparation of Terminal Electrode]

The surfaces of the first and second external electrodes were subjected to electrolytic plating to form Ni films and Sn films sequentially, thereby preparing terminal electrodes.

[Formation of n-Type Semiconductor Layer]

With a ZnO sintered body as a target, sputtering was performed with the use of a metal mask so as to partially cover one principal surface of the p-type semiconductor layer and have a partial overlap with the second external electrode, for preparing an n-type semiconductor layer with a predetermined pattern of about 0.5 μm in thickness, thereby providing a sample of sample number 1.

(Sample Number 2)

A conductive sheet was prepared in the following way.

A NiO powder and a $La_2O_3$ powder as a rare-earth oxide were each weighed so that the molar ratio was 2:1, and with the addition of pure water to these weighed compounds, subjected to mixing and grinding in a ball mill with PSZ beads as a grinding medium to obtain a slurry-like mixture. Subsequently, this slurry-like mixture was dehydrated and dried, granulated so as to have a particle diameter on the order of 50 μm, and then subjected to calcination at a temperature of 1200° C. for 2 hours to obtain a calcined powder. Next, the calcined powder thus obtained was, again with the addition of pure water thereto, subjected to grinding in a ball mill with PSZ beads as a grinding medium to obtain a slurry-like ground product of 0.5 μm in average particle diameter. Thereafter, the obtained $LaNiO_3$ powder was, again with the addition of pure water thereto, subjected to a mixing and grinding treatment in a ball mill with PSZ beads as a grinding medium, until reaching an average particle diameter of 0.5 μm. Next, the slurry subjected to this mixing and grinding treatment was dehydrated and dried, then mixed following the addition of an organic solvent and a dispersant thereto, and further with the addition of a binder and a plasticizer to prepare a slurry. Subsequently, a doctor blade method was applied to this slurry to obtain a conductive sheet of 10 μm in thickness.

Next, the same twenty (Ni, Zn)O green sheets were stacked as for sample number 1, the conductive sheet was stacked thereon, and further, one (Ni, Zn)O green sheet was stacked thereon sequentially. Then, these sheets were subjected to pressure bonding at a pressure of 200 MPa, and then cut into a size of 2.5 mm×1.5 mm to thereby prepare a laminated body.

The other steps were performed in the same way as for the sample number 1 to prepare a sample of sample number 2.

(Sample Number 3)

A p-type semiconductor layer was prepared in the same way as for the sample number 2. In addition, an insulating paste was prepared in accordance with the same method and procedure as in the first embodiment.

Then, the insulating paste was applied onto both ends of the p-type semiconductor layer to form insulating coating films. Then, a conductive paste for the formation of external electrodes was applied onto the outer surfaces of the insulating coating films to form external conductive films, and further, the conductive paste for the formation of external electrodes was also applied onto both side surfaces of the p-type semiconductor layer to form third external conductive films.

After this, as in the case of the first embodiment, a firing treatment was carried out at a temperature of 850° C. for 10 minutes to form high-resistance layers at the same time as the formation of first and second external electrodes and third external electrodes. Thereafter, the surfaces of the respective external electrodes were subjected to electrolytic plating to form Ni films and Sn films sequentially, thereby forming respective terminal electrodes.

Then, as in the case of the sample number 1, sputtering was carried out with a ZnO sintered body as a target to prepare an n-type semiconductor layer so as to form a bridge between the first external electrode and the second external electrode, thereby preparing a sample of sample number 3.

(Sample Number 4)

Figure 11:
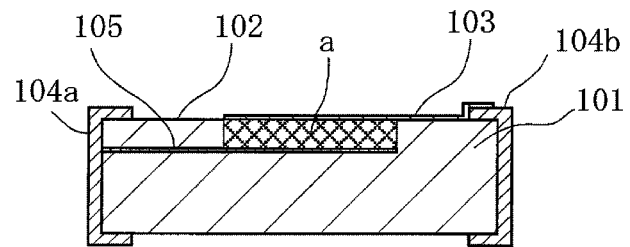
FIG. 11 is a vertical cross-sectional view of an ultraviolet sensor described in Patent Document 1.

A conventional ultraviolet sensor as described in Patent Document 1 (see FIG. 11) was prepared as sample number 4.

More specifically, first, a ZnO sintered body, (Ni, Zn)O green sheets, and a conductive paste for the formation of an internal electrode were prepared in the same way as for the sample number 1.

Subsequently, for one of the (Ni, Zn)O green sheets, by screen printing, the conductive paste for the formation of an internal electrode was applied in such a pattern that extends from one end surface of the sheet to near the center, and dried at a temperature of 60° C. for 1 hour to form a conductive film.

Subsequently, twenty (Ni, Zn)O green sheets with no conductive film formed were stacked, and the (Ni, Zn)O green sheet with the conductive film formed was stacked thereon, and further, one (Ni, Zn)O green sheet with no conductive film formed was stacked thereon sequentially. Then, these sheets were subjected to pressure bonding at a pressure of 200 MPa, and then cut into a size of 2.5 mm×1.5 mm to thereby prepare a laminated body.

Subsequently, the laminated body was placed on a setter made of $ZrO_2$ and put in a firing furnace, and subjected to degreasing slowly and adequately at a temperature of 300° C., and then to firing at a temperature of 1200° C. for 1 hour in the atmosphere, thereby providing a p-type semiconductor layer.

Thereafter, an Ag—Pd paste (Ag/Pd=95/5) was applied onto both ends of the p-type semiconductor layer, and subjected to a firing treatment at a temperature of 850° C. for 10 minutes to form first and second external electrodes, and further, the first and second external electrodes were subjected to electrolytic plating to form Ni films and Sn films sequentially.

Subsequently, with a ZnO sintered body as a target, sputtering was performed with the use of a metal mask so as to partially cover one principal surface of the p-type semiconductor layer and have a partial overlap with the second external electrode, for preparing an n-type semiconductor layer with a predetermined pattern of about 0.5 μm in thickness, thereby providing a sample of sample number 4.

[Evaluation of Samples]

For thirty samples for each of the sample numbers 1 to 4, an ultraviolet light source adjusted to an irradiance of 1 mW/cm$^2$ and fitted with a spectroscope in a dark room was used to irradiate the outer surface on the n-type semiconductor layer side while changing the wavelength of the light source stepwise every 10 nm from 200 nm to 600 nm, and the current flowing between both ends of the ultraviolet sensor was measured to examine wavelength response characteristics.

Then, the peak wavelength for the maximum photocurrent, and the average value, maximum value, and minimum value for light-receiving sensitivity at the peak wavelength (maximum light-receiving sensitivity) were figured out from the wavelength response characteristics, and the variation in maximum light-receiving sensitivity was evaluated from the maximum value and the minimum value.

In addition, a direct-current voltage of 0.1 V was applied between the terminal electrodes in a dark room to measure the dark current.

Table 1 shows the measurement results for each sample of the sample numbers 1 to 4.

It is to be noted that the measurement temperatures were each controlled to be 25° C.±1° C.

TABLE 1

| Sample No. | Peak Wavelength (nm) | Maximum Light-Receiving Sensitivity (A/W) | Variation in Maximum Light-Receiving Sensitivity (A/W) | Dark Current (nA) |
| --- | --- | --- | --- | --- |
| 1 | 360 | 0.28 | 0.26-0.30 | 0.002 |
| 2 | 360 | 0.34 | 0.32-0.34 | 0.0002 |
| 3 | 360 | 0.48 | 0.45-0.50 | 0.0004 |
| 4* | 360 | 0.25 | 0.15-0.30 | 0.05 |

*not included within the scope of the present invention

The peak wavelength was 360 nm in each case of the sample numbers 1 to 4.

However, in the case of the sample number 4, the maximum light-receiving sensitivity was as low as 0.25 A/W, the variation in maximum light-receiving sensitivity was also as large as 0.15 to 0.30 A/W among the samples, and the dark current was also increased to 0.05 nA. The reason for this is believed to be that because the tip of the internal electrode extends only to near the center of the p-type semiconductor layer, the internal electrode thus varies in dimension among the respective samples, and therefore, the overlap area also varies to cause the increased variation in maximum light-receiving sensitivity. Moreover, it is believed that since the sample number 4 has insufficient insulation between the tip of the internal electrode and the external electrode, and has resistance formed between the both electrodes, current leakage is caused from the internal electrode to the external electrode connected to the n-type semiconductor layer without ultraviolet irradiation, to increase the dark current, and as a result, also to decrease the maximum light-receiving sensitivity.

In contrast, in the case of the sample numbers 1 to 3, the ultraviolet sensors are configured within the scope of the present invention, and it has been thus determined that as compared with the sample number 4, the variation in maximum light-receiving sensitivity is smaller among products, the maximum light-receiving sensitivity is higher, and the dark current is also decreased.

In addition, in the case of the sample number 2, the plane area of a principal surface of the internal electrode is equal to the plane area of a principal surface of the p-type semiconductor layer, with a large overlap area therebetween, and the internal electrode also undergoes a decrease in resistance. Thus, as compared with the sample number 1, the variation in maximum light-receiving sensitivity was further reduced among the samples, the dark current was further decreased, and the maximum light-receiving sensitivity was further increased.

Furthermore, in the case of the sample number 3, the plane area of a principal surface of the internal electrode is equal to the plane area of a principal surface of the p-type semiconductor layer as in the case of the sample number 2, and additionally, the effective distance between the external electrodes for detecting photocurrent is shortened to reduce the resistance. Thus, it has been determined that even as compared with the sample number 2, the dark current can be further reduced, the maximum light-receiving sensitivity is further increased, and the variation in maximum light-receiving sensitivity is also favorable between the samples.

Ultraviolet sensors can be achieved which achieve reduced variation in characteristics with respect to ultraviolet intensity among products, also produce low dark current, and have high maximum light-receiving sensitivity.

DESCRIPTION OF REFERENCE SYMBOLS 1, 13, 17 p-type semiconductor layer
2, 14, 23 n-type semiconductor layer
3, 12, 18 internal electrode
4, 21a, 21b high-resistance layer
5a, 22a first external electrode
5b, 22b second external electrode
6, 19a, 19b first high-resistance layer
7, 20a, 20b second high-resistance layer
8a to 8n, 14a to 14n (Ni, Zn)O green sheet
9 conductive film
16 conductive sheet
24a, 24b third external electrode

The invention claimed is:

1. An ultraviolet sensor comprising:
a p-type semiconductor layer containing, as its main constituent, a solid solution of NiO and ZnO;
an n-type semiconductor layer containing ZnO as its main constituent, the n-type semiconductor layer joined to the p-type semiconductor layer such that a portion of the p-type semiconductor layer is exposed at a surface of the ultraviolet sensor;
an internal electrode buried in the p-type semiconductor layer and opposed to the n-type semiconductor layer such that first and second ends of the internal electrode are exposed at opposed end surfaces of the p-type semiconductor layer;
a resistance layer composed of an insulating material covering the first end of the internal electrode;
a first external electrode electrically connected to the second end of the internal electrode; and
a second external electrode electrically connected to the n-type semiconductor layer.

2. The ultraviolet sensor according to claim 1, wherein the resistance layer comprises:
a first resistance layer composed of the insulating material, the first resistance layer interposed between the second external electrode and the p-type semiconductor layer; and
a second resistance layer having the insulating material diffused into the p-type semiconductor layer so as to cover the one end of the internal electrode.

3. The ultraviolet sensor according to claim 1, wherein a width dimension of the n-type semiconductor layer along an end surface of the p-type semiconductor layer is larger than a width dimension of the internal electrode opposed to the n-type semiconductor layer.

4. The ultraviolet sensor according to claim 1, wherein a width dimension of the internal electrode along an end surface of the p-type semiconductor layer is larger than a width dimension of the n-type semiconductor layer opposed to the internal electrode.

5. The ultraviolet sensor according to claim 1, wherein the resistance layer is colored in a color that is distinguishable from a color of at least one of the p-type semiconductor layer, the n-type semiconductor layer, the internal electrode the first external electrode and the second external electrode.

6. The ultraviolet sensor according to claim 1, wherein the internal electrode comprises a composite oxide containing a rare earth element and Ni as its main constituents.

7. An ultraviolet sensor comprising:
a p-type semiconductor layer containing, as its main constituent, a solid solution of NiO and ZnO;
an n-type semiconductor layer containing ZnO as its main constituent, the n-type semiconductor layer joined to the p-type semiconductor layer; and
an internal electrode buried in the p-type semiconductor layer and opposed to the n-type semiconductor layer such that first and second end surfaces and first and second side surfaces are exposed from the p-type semiconductor layer;
a first resistance layer composed of a first insulating material covering the first end of the internal electrode;
a second resistance layer composed of a second insulating material covering the second end of the internal electrode;
a first external electrode on a surface of the first resistance layer, and electrically connected to the n-type semiconductor layer;
a second external electrode on a surface of the second resistance layer, and electrically connected to the n-type semiconductor layer; and
at least one third external electrode on at least one side surface of the p-type semiconductor layer.

8. The ultraviolet sensor according to claim 7, wherein the first and second resistance layers each comprise:
a third resistance layer composed of the insulating material, the third resistance layer being interposed between the first and second external electrodes and the p-type semiconductor layer; and
a fourth resistance layer having the insulating material diffused into the p-type semiconductor layer so as to cover the first and second ends of the internal electrode.

9. The ultraviolet sensor according to claim 7, wherein the internal electrode comprises a composite oxide containing a rare earth element and Ni as its main constituents.

* * * * *